US009472613B2

United States Patent
Cappellani et al.

(10) Patent No.: US 9,472,613 B2
(45) Date of Patent: *Oct. 18, 2016

(54) CONVERSION OF STRAIN-INDUCING BUFFER TO ELECTRICAL INSULATOR

(71) Applicant: INTEL CORPORATION, Santa Clara, CA (US)

(72) Inventors: Annalisa Cappellani, Portland, OR (US); Van H. Le, Portland, OR (US); Glenn A. Glass, Beaverton, OR (US); Kelin J. Kuhn, Aloha, OR (US); Stephen M. Cea, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/844,816

(22) Filed: Sep. 3, 2015

(65) Prior Publication Data

US 2015/0380481 A1    Dec. 31, 2015

Related U.S. Application Data

(63) Continuation of application No. 13/976,068, filed as application No. PCT/US2012/033472 on Apr. 13, 2012, now Pat. No. 9,129,827.

(51) Int. Cl.
*H01L 29/737*      (2006.01)
*H01L 29/06*       (2006.01)
(Continued)

(52) U.S. Cl.
CPC ....... *H01L 29/0603* (2013.01); *H01L 21/0245* (2013.01); *H01L 21/02439* (2013.01);
(Continued)

(58) Field of Classification Search
CPC ............. H01L 33/12; H01L 21/02304; H01L 29/7378
USPC .......................................................... 257/190
See application file for complete search history.

(56) References Cited

U.S. PATENT DOCUMENTS 4,952,527 A    8/1990  Calawa et al.
5,844,303 A   12/1998  Kikkawa et al.
(Continued)

OTHER PUBLICATIONS

Liang, et al., "Nonselective oxidation of GaAs-based III-V compound semiconductor heterostructures for in-plane semiconductor lasers," Feb. 8, 2007, 14 pages.
(Continued)

*Primary Examiner* — George Fourson, III
(74) *Attorney, Agent, or Firm* — Finch & Maloney PLLC

(57) ABSTRACT

Techniques are disclosed for converting a strain-inducing semiconductor buffer layer into an electrical insulator at one or more locations of the buffer layer, thereby allowing an above device layer to have a number of benefits, which in some embodiments include those that arise from being grown on a strain-inducing buffer and having a buried electrical insulator layer. For instance, having a buried electrical insulator layer (initially used as a strain-inducing buffer during fabrication of the above active device layer) between the Fin and substrate of a non-planar integrated transistor circuit may simultaneously enable a low-doped Fin with high mobility, desirable device electrostatics and elimination or otherwise reduction of substrate junction leakage. Also, the presence of such an electrical insulator under the source and drain regions may further significantly reduce junction leakage. In some embodiments, substantially the entire buffer layer is converted to an electrical insulator.

20 Claims, 9 Drawing Sheets

(51) Int. Cl.
  *H01L 21/76* (2006.01)
  *H05K 1/18* (2006.01)
  *H01L 29/66* (2006.01)
  *H01L 29/78* (2006.01)
  *H01L 29/10* (2006.01)
  *H01L 21/02* (2006.01)
  *H01L 33/12* (2010.01)

(52) U.S. Cl.
  CPC ... *H01L21/02488* (2013.01); *H01L 21/02532* (2013.01); *H01L 21/76* (2013.01); *H01L 29/0642* (2013.01); *H01L 29/0657* (2013.01); *H01L 29/1054* (2013.01); *H01L 29/66795* (2013.01); *H01L 29/785* (2013.01); *H05K 1/18* (2013.01); *H01L 21/02304* (2013.01); *H01L 29/7378* (2013.01); *H01L 33/12* (2013.01)

(56) References Cited

U.S. PATENT DOCUMENTS

| | | |
|---|---|---|
| 6,144,060 A | 11/2000 | Park et al. |
| 6,703,638 B2 | 3/2004 | Danzilio |
| 7,425,751 B2 | 9/2008 | Balasubramanian et al. |
| 7,459,731 B2 | 12/2008 | Xie et al. |
| 2001/0045604 A1 | 11/2001 | Oda et al. |
| 2003/0183819 A1 | 10/2003 | Aoki et al. |
| 2004/0259315 A1 | 12/2004 | Sakaguchi et al. |
| 2005/0023554 A1 | 2/2005 | Chu et al. |
| 2009/0155931 A1 | 6/2009 | Ma et al. |
| 2010/0163848 A1 | 7/2010 | Majhi et al. |
| 2011/0266595 A1 | 11/2011 | Hata |
| 2012/0056244 A1 | 3/2012 | Bahl et al. |
| 2013/0207161 A1 | 8/2013 | Wang et al. |
| 2014/0285980 A1 | 9/2014 | Cappellani et al. |

OTHER PUBLICATIONS

International Search Report and Written Opinion received for PCT Patent Application No. PCT/US2012/033472, mailed on Jan. 2, 2013, 13 Pages.

International Preliminary Report on Patentability received in PCT Application No. PCT/US2012/033472, dated Oct. 14, 2014, 9 pages.

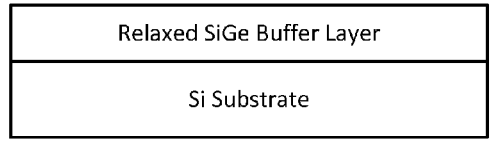
Fig. 2a
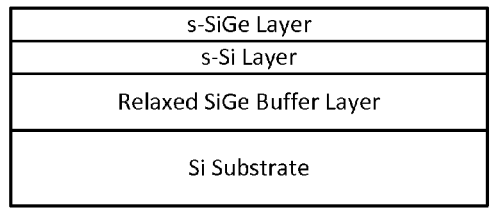
Fig. 2b
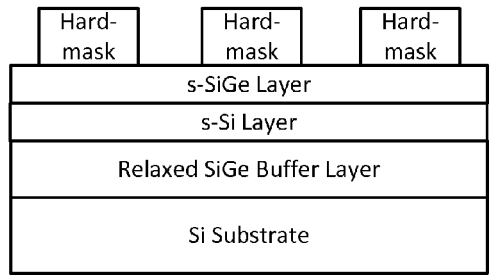
Fig. 2c
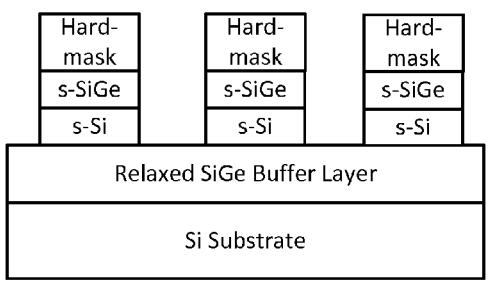
Fig. 2d
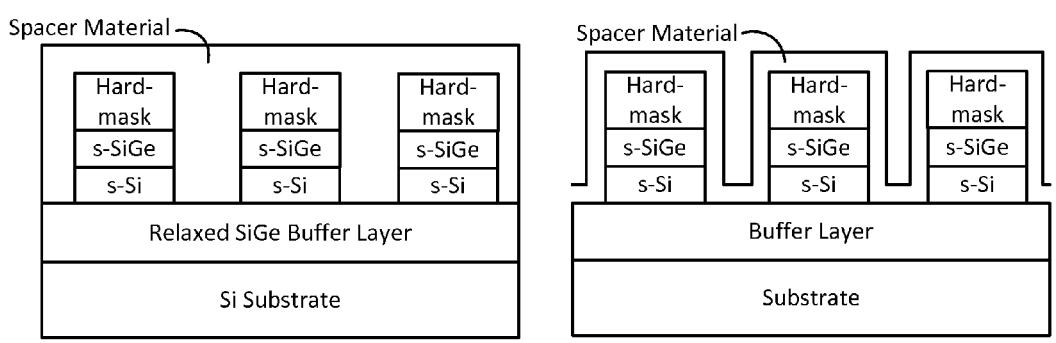
Fig. 2e  Fig. 2e'

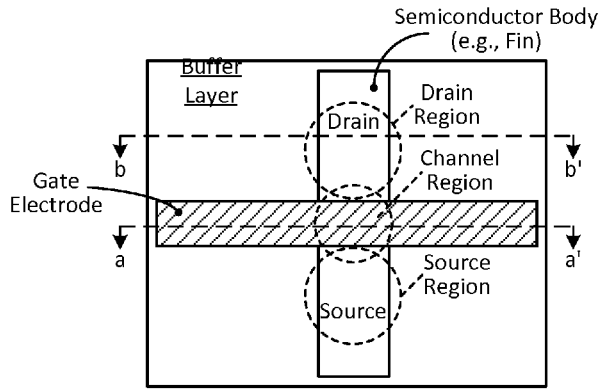
Fig. 4a
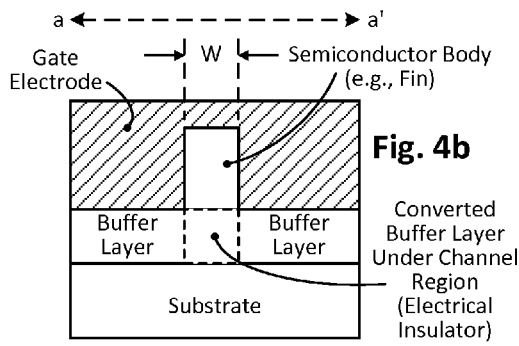
Fig. 4b
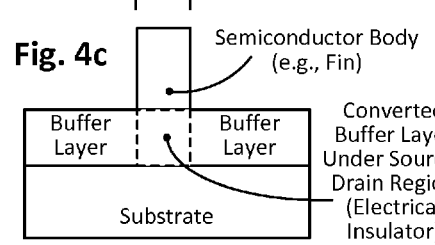
Fig. 4c
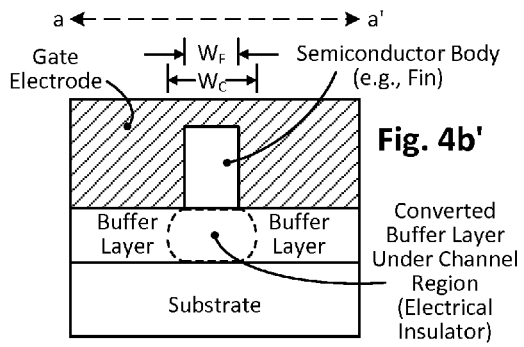
Fig. 4b'
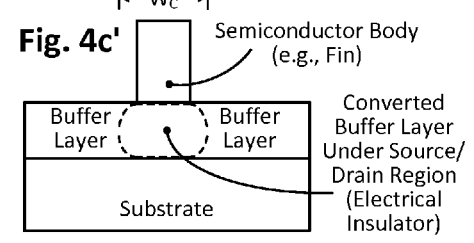
Fig. 4c'
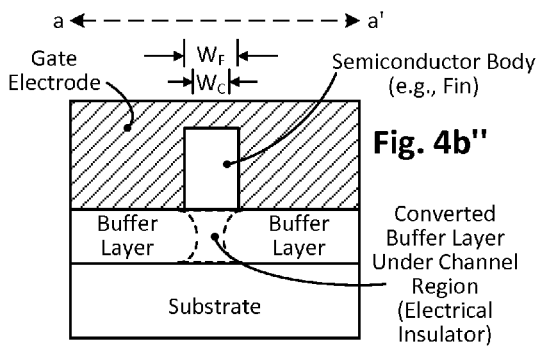
Fig. 4b"
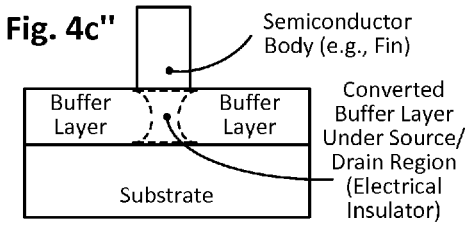
Fig. 4c"

CONVERSION OF STRAIN-INDUCING BUFFER TO ELECTRICAL INSULATOR

RELATED APPLICATION

This application is a continuation of U.S. application Ser. No. 13/976,068 filed Jun. 26, 2013, which is a U.S. National Phase of International Application PCT/US12/033472 filed Apr. 13, 2012. Each of these applications is herein incorporated by reference in its entirety.

BACKGROUND

In the context of semiconductor structures, a buffer typically refers to a layer of semiconductor material sandwiched between two disparate material layers to accommodate a difference in lattice constants or crystallographic structures of those layers. A buffer effectively inhibits misfit dislocation between the disparate layers, and can also induce strain in neighboring layers. The composition of the buffer can be selected based on the composition of the disparate layers.

BRIEF DESCRIPTION OF THE DRAWINGS

FIGS. 2a-2i''' illustrate various example structures that are formed when carrying out a method for fabricating an integrated circuit having a strain-inducing buffer layer that has been converted to an electrical insulator in at least one location, in accordance with various embodiments of the present invention.

FIG. 4a illustrates a top view of a non-planar semiconductor device architecture, configured in accordance with an embodiment of the present invention.

FIGS. 4b, 4b', and 4b'' each illustrates a cross-section side view of the semiconductor device of FIG. 4a, as taken along the a-a' axis, configured in accordance with an embodiment of the present invention.

FIGS. 4c, 4c', and 4c'' each illustrates a cross-section side view of the semiconductor device of FIG. 4a, as taken along the b-b' axis, configured in accordance with an embodiment of the present invention.

Figure 1A:
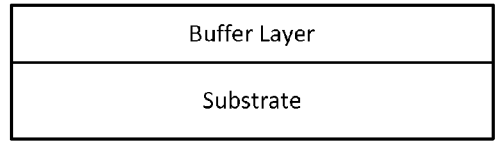
FIGS. 1a-1i illustrate various example structures that are formed when carrying out a method for fabricating an integrated circuit having a strain-inducing buffer layer that has been converted to electrical insulator in at least one location, in accordance with an embodiment of the present invention.

As will be appreciated, the figures are not necessarily drawn to scale or intended to limit the claimed invention to the specific configurations shown. For instance, while some figures generally indicate straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for converting a strain-inducing semiconductor buffer layer into an electrical insulator at one or more locations of the buffer layer, thereby allowing the above device layer to have a number of benefits, which in some embodiments include those that arise from being grown on a buffer and having a buried electrical insulator layer. For instance, having a buried electrical insulator layer (initially used as a strain-inducing buffer during fabrication of the above active device layer) between the Fin and substrate of a non-planar integrated transistor circuit may simultaneously enable a low-doped Fin with high mobility (and correspondingly, low misfit dislocation), desirable device electrostatics and elimination or otherwise reduction of substrate junction leakage. Also, the presence of such an electrical insulator under the source and drain regions may further significantly reduce junction leakage. In some embodiments, substantially the entire buffer layer is converted to an electrical insulator.

General Overview

As previously explained, a semiconductor buffer can be used to inhibit misfit dislocations between the disparate material layers, and can be used to induce desired strain in neighboring material layers. However, there are a number of complexities and non-trivial issues associated with such buffers. For example, while a buffer layer can be used to grow a higher quality epitaxial layer on top thereof that otherwise would be very defective, or to grow strained films, it is also a parasitic layer and causes integration and device issues (e.g., sub-Fin leakage) if left behind.

Thus, in accordance with an embodiment of the present invention, a methodology is provided to effectively convert a given semiconductor buffer layer of an integrated circuit to a dielectric layer through which current cannot pass, thereby leaving the above device layers of the integrated circuit electrically isolated from the underlying substrate. However, the converted buffer layer still provides the desired strain to the above device layer. As such, it is as if the device layer formed on a buffer layer of a bulk substrate was built on, for instance, a silicon-on-insulator (SOI) wafer or other semiconductor-on-insulator wafer, but still maintains the quality of having been grown on a buffer.

The techniques can be implemented at any process node (including 14 nm and beyond) and on various non-planar architectures, such as FinFET devices (e.g., double-gate, tri-gate, omega-gate, and pi-gate transistors), Fin with gate-all-around transistor devices, and nanowire and nano-ribbon transistor devices. In one such Fin-based embodiment, the methodology includes etching the Fin down to the buffer layer, and then building a spacer around the Fin sidewalls that can be used to selectively expose the buffer area to be converted into a dielectric. This in turn allows the buffer layer to be electrically isolated from the above device layers while further maintaining the above device layers with the desired properties (such as compressive strain for p-type metal oxide semiconductor devices and/or tensile strain for n-type metal oxide semiconductor devices).

The resulting buffer/dielectric layer can be, for instance, an electrically insulating oxide layer at select locations of the buffer (or substantially the entire buffer), and the above device layers may include, for example, transistors and/or other active and/or passive electronic components commonly used in an integrated circuit (e.g., diodes, resistors, capacitors, inductors, etc). In such embodiments, the oxidation of the buffer can be carried out using thermal re-oxidation.

Example buffer materials that can be converted to an insulating dielectric as described herein include, for instance, silicon, silicon germanium (SiGe), germanium, or III-V materials. Specific examples and applications include, for instance, a relaxed germanium on a germanium carbide (GeC) buffer that can be used as virtual germanium substrate to fabricate, for instance, germanium complementary metal oxide semiconductor (CMOS) devices, such as compressively strained germanium p-type metal oxide semiconductor field effect transistors (MOSFETs) with germanium tin (GeSn) source/drain stressors, and tensile strained germanium n-type MOSFETs with SiGe source/drain stressors. Buffers can also be used, for instance, as a buffer layer in optoelectronic devices, where tensile-strain can be used to achieve direct bandgap. In other example cases, buffer layers can be used in III-V material devices, such as those formed by depositing germanium on silicon and then growing a thick gallium arsenide (GaAs) buffer layer. Numerous other buffer material systems, configurations, and applications will be apparent in light of this disclosure, and any such variations can be used in accordance with, or otherwise benefit from, an embodiment of the present invention.

In addition to the various buffer material systems, configurations, and applications, there are a number of strategies for generating relaxed buffer layers with desired threading dislocation densities (e.g., as low as $1E^{16}$ dislocations/cm$^2$). As will be appreciated in light of this disclosure, these various strategies, some of which will now be discussed in turn, can all benefit from an intermediate or subsequent thermal annealing process to complement the relaxation process and/or effect conversion of the given buffer layer into an insulating dielectric layer, in accordance with an embodiment of the present invention. One example such strategy includes the deposition of thick buffer layers (many microns thick). This technique relies upon dislocations merging and opposite pairs annihilating themselves through the thickness of the film, and is generally the least effective and requires the thickest buffer layers.

Another strategy is known as multilayer dislocation looping. This technique relies on deposition of layers of high and low germanium concentration. Each interface of such pairs of layers is a concentrated stress location that can be effective in turning the direction of a threading dislocation from vertical to horizontal. In this manner, such an interface can cause misfit dislocations to loop upon themselves rather than threading to the top surface. Deposition is then followed by a thick (several microns) buffer layer to restore surface smoothness and defect density.

For buffers that are targeted for germanium layers, additional variations on the techniques are available. For instance, pure germanium buffers on silicon can be grown with greater smoothness using carbon or other surfactant impurities to increase the surface energy which avoids roughness. Many of the buried stacking faults in films originate at valleys that form during rough film surface stages of growth and are subsequently frozen in. Thus, growing the buffer with greater smoothness has the effect of minimizing or otherwise reducing buried stacking faults.

Another technique includes patterning of insulator layers such as silicon dioxide ($SiO_2$) with an array of holes and a subsequent germanium deposition can concentrate the dislocations and stacking faults to the regions above the holes. Regions above the insulator tend to be very high quality with local dislocation densities as low as $1E^4$ dislocations/cm$^2$. In such cases, post-treatment with one or more annealing processes can result in partial or even full dissolution of an interfacial oxide layer and the oxygen diffuses to and desorbs from the germanium surface. This process also results in annihilation of many of the dislocations that were initially in the insulator hole regions and makes the entire film uniform of defect density.

Any such buffer strategies can be supplemented with the buffer conversion techniques as described herein, so as to provide the above device layers the benefit of being built on both a semiconductor-on-insulator wafer and a strain-inducing buffer. Such a technique enables a significant cost reduction relative to currently available wafer bonding processes which presume the use of premade SOI wafers. A scanning electron microscopy (SEM) or transmission electron microscopy (TEM) cross-section perpendicular to gate lines or Fins can be used to show the converted buffer or buffer locations in non-planar transistor structures, in accordance with some embodiments of the present invention. For instance, in some such embodiments, the SEM/TEM cross-section will show oxidation of the buffer at one or more sub-Fin locations, which may include the entire buffer, or only buffer regions under the channel and/or source and drain regions.

Methodology

FIGS. 1a-1i illustrate various example structures that are formed when carrying out a method for fabricating an integrated circuit having a strain-inducing buffer layer that has been converted to electrical insulator in at least one location, in accordance with an embodiment of the present invention. The resulting structure generally provides an integrated circuit with a semiconductor body portion or Fin that is electrically isolated from the underlying substrate. In some example cases where the semiconductor device comprises, for instance, a MOSFET, the method allows for electrical isolation of the channel and/or source and drain regions of the MOSFET from the underlying substrate. As will be appreciated in light of this disclosure, this electrical isolation is achieved by way of a strain-inducing buffer disposed between the active device area and the underlying substrate, wherein the buffer is initially used to induce desired strain in the above active device layer, but is then subsequently converted to further provide electrical isolation. In some such embodiments, one or more electrically insulating regions are selectively formed within the buffer layer between a semiconductor body and a semiconductor substrate. In other embodiments, substantially the entire buffer is converted to an electrically insulating region (e.g., 85% or more of the buffer is converted, or 95% or more of the buffer is converted). The techniques are generally referred to as under-Fin oxidation (UFO) processes, and can be used to suppress or entirely block leakage in a resulting semiconductor device. Note that the electrically insulating regions or area of the buffer formed during the conversion process may be distinguished from other adjacent subsequently added electrically isolating material, even if composed of the same material.

As can be seen in FIG. 1a, a buffer layer is deposited over a substrate. The substrate generally may be composed of a material suitable for semiconductor device fabrication. In one example embodiment, the substrate is a bulk substrate. For example, in some specific such embodiments, the substrate is a bulk substrate composed of a single crystal of a material which may include, but is not limited to, silicon, germanium, SiGe, silicon carbide (SiC), germanium carbide (GeC), or a III-V compound semiconductor material. Alternatively, the substrate may include an upper epitaxial layer and a lower bulk portion, either of which may be composed of a single crystal of a material which may include, but is not limited to, silicon, germanium, SiGe, or a III-V compound semiconductor material. An intervening insulator layer composed of a material which may include, but is not limited to, silicon dioxide, silicon nitride or silicon oxy-nitride may be disposed between the upper epitaxial layer and the lower bulk portion. Some further embodiments may utilize a pre-formed semiconductor-on-insulator substrate (e.g., SOI), if so desired. As previously explained, example buffer materials include, for instance, silicon, germanium, SiGe, SiC, GeC, or III-V materials. Thus, in one specific example, the substrate is a bulk single-crystalline silicon semiconductor substrate, and the buffer is SiGe. In another specific example, the substrate is germanium deposited on silicon and the buffer is a thick GaAs layer grown thereon. Numerous other substrate and buffer material systems and configurations will be apparent in light of this disclosure, and any such variations can be used in accordance with an embodiment of the present invention.

In some embodiments, the buffer layer is substantially uniform with respect to the concentration of materials of which it is made. In other embodiments, however, the buffer may have one or more material concentration levels that are graded. For instance, a SiGe buffer layer can have a germanium concentration that graded from a base level compatible with the underlying substrate (e.g., 20 to 30 atomic %) up to some target high concentration level (e.g., 50 to 65 atomic %). In a similar fashion, if the buffer layer is doped, for whatever reason, then that dopant concentration within the buffer can be either fixed or graded, for instance, from a base concentration at or otherwise compatible with the underlying substrate up to a desired high concentration. Note that 'compatibility' as used herein does not necessitate an overlap in concentration levels (for instance, the germanium concentration of underlying substrate can be 0 to 20 atomic % and the initial germanium concentration of the buffer can be 30 to 40 atomic %). In addition, as used herein, the term 'fixed' with respect to a concentration level is intended to indicate a relatively constant concentration level (e.g., the lowest concentration level in the layer is within 10% of the highest concentration level within that layer). In a more general sense, a fixed concentration level is intended to indicate the lack of an intentionally graded concentration level. A graded buffer can be used, for instance, to lower the Schottky-barrier height, if so desired.

The thickness of the buffer layer can vary depending on factors such as the desired range of strain to be induced in the above active device layer and the various material concentrations being buffered, but in some embodiments is in the range of 30 to 500 Å on the thin end, or 50 to 5000 nanometers on the thick end. In a more general sense, the buffer can have any thickness that allows for it to both provide the desired strain to the above active device layer and provide the desired degree of electrical isolation between the above active device layer and underlying substrate. The claimed invention is not intended to be limited to any particular buffer dimensions.

Figure 1B:
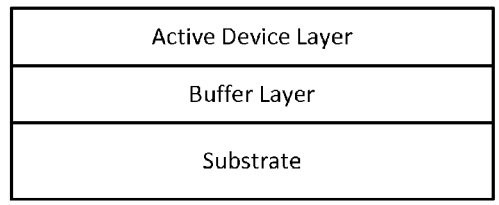

FIG. 1b shows an active device layer deposited or otherwise formed on the buffer layer. The active device layer can include any number of suitable semiconductor material layers (e.g., silicon, germanium, or SiGe, III-V materials), depending on the particular device being formed and the application. Once fully formed, the device layer may include, for example, active componentry such as transistors and/or diodes, and may further include passive componentry as well, such as capacitors, inductors, and various conductors (e.g., runs, contact pads, etc). In general, the active device layer material can be selected, for instance, to provide a desired degree of compressive and/or tensile strain in conjunction with the underlying buffer material layer, so as to provide an enhanced degree of hole and/or electron mobility. Numerous device layer configurations can be implemented, and the claimed invention is not intended to be limited to any particular one. In any such cases, the device layer may be susceptible to leakage current into the underlying substrate by way of the buffer layer. For instance, the device layer may include CMOS circuitry having both compressively strained p-type and tensilely strained n-type MOSFETs implemented with a non-planar architecture, such as FinFET or nanowire transistors.

Figure 1C:
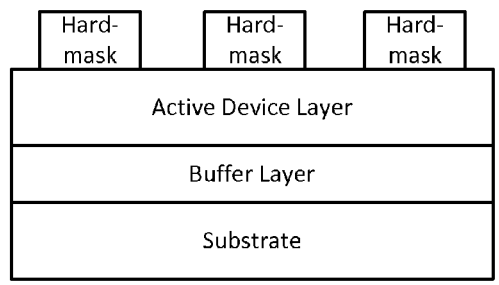

FIG. 1c shows a patterned hardmask layer formed on the active device layer. The hardmask is used to pattern the semiconductor body area or Fins. The hardmask layer may include, for example, a single layer hardmask or a multilayer (e.g., bilayer of two distinct materials, depending on the complexity of the circuit being formed and processes being used, as will be appreciated. The hardmask layer can be used to provide certain benefits or uses during processing, such as protecting the existing circuitry and materials of the active device layer from subsequent etch and other processes. The hardmask layer may be formed using typical hardmask materials, such as such as silicon dioxide, silicon nitride, or a multilayer structure of such materials. Any number of suitable mask forming schemes and materials can be used, as will be appreciated.

Figure 1D:
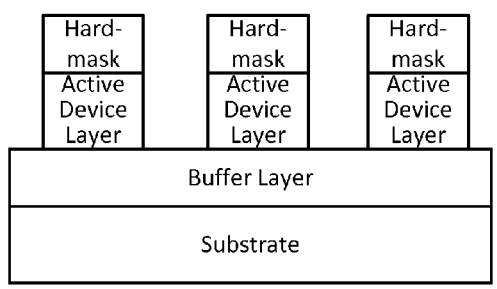

FIG. 1d shows the structure after an etch process has been performed that provides the semiconductor bodies or Fins. The etch can be carried out, for instance, using standard wet and/or dry etch processes (e.g., isotropic and/or anisotropic), depending on the materials used and desired etch profile. As can be further seen, the depth of the etch exposes the underlying buffer layer.

Figure 1E:
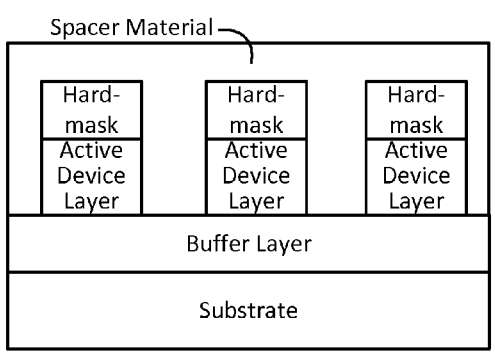
Figure 1E:
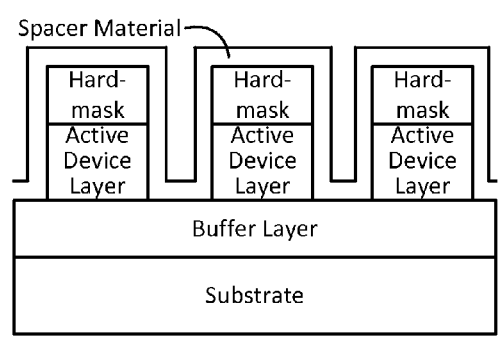
Figure 1F:
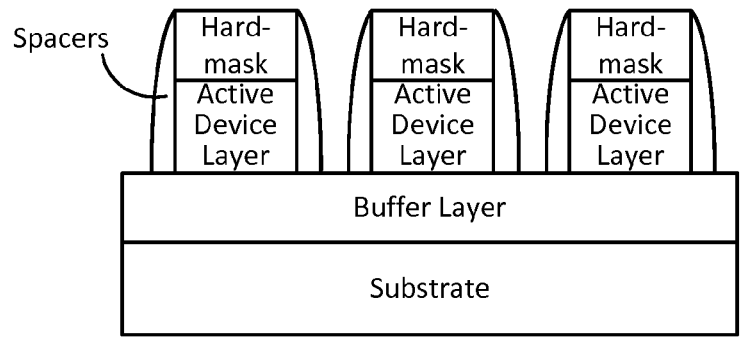

FIG. 1e shows an example resulting structure after deposition of a spacer material layer. As can be seen in this example embodiment, the spacer material layer deposition is carried out such that the voids between the semiconductor bodies or Fins are completely filled in with spacer material due to, for instance, small pitch of the Fin structure (e.g., the thickness of the spacer material layer is 2× or more than the width of the space between the Fins). In an alternative embodiment shown in FIG. 1e', the thickness of the spacer material layer is less than 2× the width of the space between the Fins, so as to provide a conformal spacer material layer as shown. The spacer material layer can be provided, for example, using atomic layer deposition (ALD) or other suitable deposition technique, such as chemical vapor deposition (CVD). In any such cases, note that the spacer deposition does not need to be planarized, because in some embodiments a subsequent directional etch (e.g., wet and/or dry anisotropic etch) can be used to remove the excess spacer material over the hardmask and between the fins. Further note that the hardmask slows the etch rate in the hardmask areas, and the spacer material has a higher etch rate than the hardmask. Thus, given an anisotropic etch, for instance, the resulting spacers along the sidewalls of the hardmask and Fins as shown in Figure if can be formed. The spacer material can be, for instance, a nitride or oxide (e.g., silicon nitride or silicon dioxide), or other spacer material that will facilitate the subsequent buffer etch shown in FIG. 1h. Note that additional mask deposition and patterning processes can be used to facilitate the spacer formation process, if so desired. Still in other embodiments, the spacer material layer deposition can be selectively applied along the sidewalls of the hardmask and Fins, thereby eliminating or otherwise reducing the need for the spacer etch. Any number of deposition/etch schemes can be used to provide the spacers as generally shown, as will be appreciated in light of this disclosure.

Figure 1G:
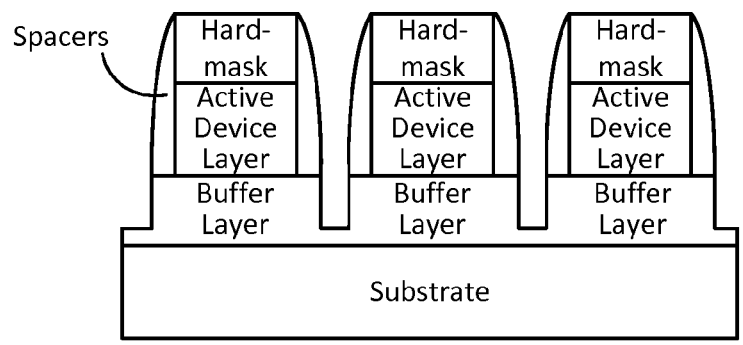

With the spacers in place, a further etch process is then carried out to selectively remove buffer material exposed between the spacers, as shown in FIG. 1g. Given the protection provided by the hardmask and spacers, the buffer etch can be generally applied to the structure (e.g., wet and/or dry isotropic etch), but can also be carried out using a directional etch process (e.g., wet and/or dry anisotropic etch). The depth of the etch can vary from one embodiment to the next, but is generally selected to expose the buffer material underneath the semiconductor body (Fin). In some example embodiments, for instance, the etch depth is 40% to 90% of the buffer thickness. In a more general sense, the buffer can be etched to any depth that allows for both the desired strain of the above device layer to remain intact and the desired degree of buffer conversion (e.g., to oxide) for a given conversion process, given consideration of other conversion process parameters such as desired conversion temperature and/or duration. For instance, a greater etch depth into the buffer layer may enable, for example, a lower conversion temperature and/or a shorter duration. Such lower conversion temperatures and/or conversion process duration may be beneficial to the overall semiconductor process, depending on the circuitry and deployed materials being subjected to the conversion process. The buffer etch may be further configured to undercut the semiconductor body, if so desired. The profile of the etch and undercut (if any) will depend on the particular etch regime used as well as the type of buffer material being etched. For instance, in one specific embodiment having a GaAs buffer layer, an isotropic etch such as an isotropic wet etch (e.g., hydrochloric acid) can be used and resulting undercut portions have rounded edges. In another specific embodiment having a silicon buffer layer, an anisotropic etch such as an anisotropic dry etch (e.g., plasma etch or reactive ion etching) is used and the undercut portions have faceted edges.

Figure 1H:
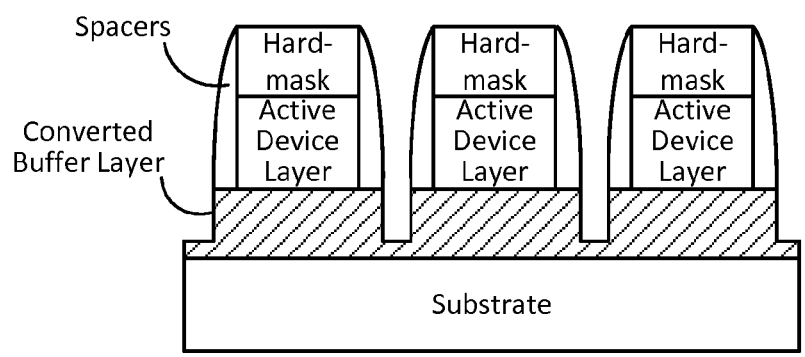

FIG. 1h shows the resulting structure after the buffer has been converted to a dielectric or insulating layer through which current cannot pass. In one such embodiment, the conversion is carried out by annealing the structure to form, by oxidation, an electrically insulating region in the buffer area between the semiconductor body and the substrate. Depending on the duration of the annealing process, substantially the entire buffer may be converted to a dielectric material that electrically isolates the Fin from the substrate. In general, the exposed buffer regions under the spacers will generally convert first, with the remainder of the buffer layer to follow, should sufficient time be allocated to the annealing process. In one example embodiment, an oxidizing atmosphere is used, where oxygen gas is provided during the annealing process. The gas flow can be any suitable flow (e.g., oxygen flow from about 1 sccm to about 50 sccm), and the annealing temperature range can vary depending on the materials of the structure (e.g., 500° C. to about 1500° C.). In a more general sense, the buffer layer may oxidize at a temperature that does not damage or otherwise adversely impact the overall structure or performance of the device being formed. Numerous other thermal annealing and oxidation schemes can be used, such as oxygen implantation and/or leveraging oxidizing material adjacent to the buffer layer. The result of the conversion process is that the strain-inducing buffer layer now operates as a dielectric to electrically isolate the semiconductor body or Fin from the underlying substrate.

Figure 1I:
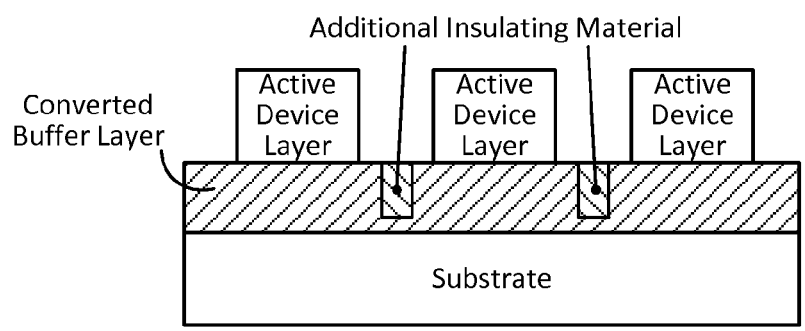

FIG. 1i illustrates the resulting structure after planarization of the converted buffer layer. In one such embodiment, the converted buffer layer is planarized by depositing more oxide material or other suitable insulating material that is compatible with an oxide formed during the conversion process, and then recessing the deposited oxide material with an etch (e.g., wet and/or dry etch process). The additional insulating material may be the same as the converted buffer material, or may be different than the converted buffer material. In either case, in some embodiments, the converted buffer material can still can be detected and distinguished from subsequently added insulating material deposited during the planarization process. Once the buffer has been converted, the hardmask and spacers can be removed (e.g., using any combination of wet/dry etching).

As will be appreciated, the depicted methodology can be carried out using any suitable standard semiconductor processes, including lithography, chemical vapor deposition (CVD), atomic layer deposition (ALD), spin-on deposition (SOD), physical vapor deposition (PVD), wet and dry etching. Alternate deposition techniques may be used as well, for instance, various material layers may be thermally grown. As will be further appreciated in light of this disclosure, any number of suitable materials, layer geometries, and formation processes can be used to implement an embodiment of the present invention, so as to provide a low leakage current device or structure as described herein. As will be further appreciated, other additional preliminary, intermediate, and/or subsequent structures and processing not reflected in FIGS. 1a-1i may be included (e.g., such as additional patterning, cleaning, polishing/planarization processes).

FIGS. 2a-2i illustrate various example structures that are formed when carrying out a method for fabricating an integrated circuit having a strain-inducing buffer layer that has been converted to an electrical insulator in at least one location, in accordance with another embodiment of the present invention. This example methodology is similar to the methodology discussed with reference to FIGS. 1a-1i, but is specifically geared toward converting a buffer layer under a strained Si/SiGe device layer stack. In general, such a strained device layer stack may be used, for instance, for fabricating nanowire (or nano-ribbon) transistor devices having strained channel regions and/or strained source/drain regions. While the structures shown in FIGS. 1a-1i where directed to Fin-based transistors, various relevant portions of that previous discussion are equally applicable to nanowire/nano-ribbon transistor devices, as will be appreciated.

FIG. 2a shows the deposition of a SiGe buffer layer that is relaxed in order to grow the strained Si/SiGe device layer stack on top, as shown in FIG. 2b. While specific material layers are provided, and as will be appreciated in light of this disclosure, this methodology can be applicable to any number of buffer configurations, depending on factors such as the materials used for the device layer and the desired strain scheme (e.g., tensile strain, compressive strain, or both). In this example embodiment, a first active device layer is a silicon layer on a relaxed SiGe buffer layer, and a second active device layer is a SiGe layer on the silicon layer. The device layer stack is then patterned (as shown in FIG. 2c) and etched so as to form a plurality of multi-layer semiconductor bodies or Fins (as shown in FIG. 2d). This patterning and Fin formation results in a uniaxial tensile strain along the current flow direction in the strained silicon (s-Si) layer, and a uniaxial compressive strain along the current flow direction in the strained SiGe (s-SiGe) layer. As will be appreciated, the current flow may be, for instance, from the source to drain through the channel (assuming a FET configuration) or from the anode to cathode (assuming a diode configuration).

Further note that each resulting active device of the device layer can have active regions (e.g., source/channel/drain or cathode/anode) that are discrete and distinct from the active regions of the active devices of other device layers in the stack. To this end, there may be intervening layers within the device stack so as to provide, for example, isolation between the distinct active device layers. Likewise, the various layers making up the active device layer stack can be selected to provide a desired strain (e.g., compressive or tensile strain) in a corresponding next layer in the stack. For instance, in one specific example embodiment, a first nanowire or nano-ribbon device is composed of silicon, and a second nanowire or nano-ribbon device above the first device is composed of $Si_xGe_y$, where $0<x<100$, and $0<y<100$. In one such embodiment, the first nanowire or nano-ribbon device is a tensilely strained NMOS device, and the second nanowire or nano-ribbon device is a compressively strained PMOS device. In one example such case, x is approximately 30 and y is approximately 70. However, other stoichiometries may be selected as well, so long as they maintain the desired strain within the layer (e.g., $Si_{40}Ge_{60}$).

Figure 2F:
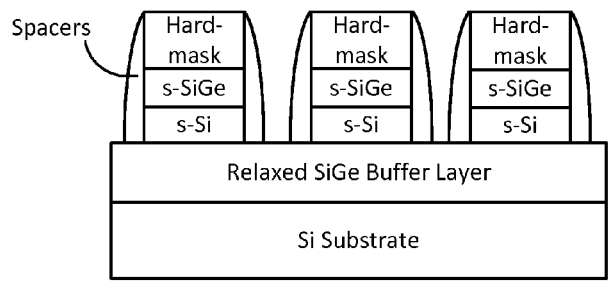
Figure 2G:
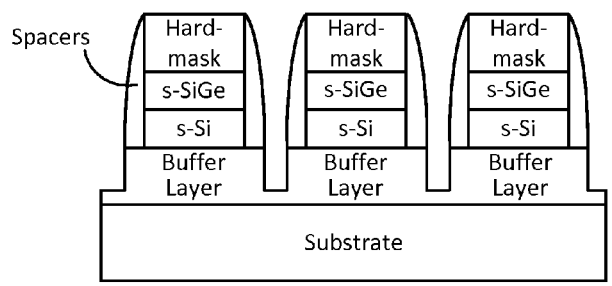
Figure 2H:
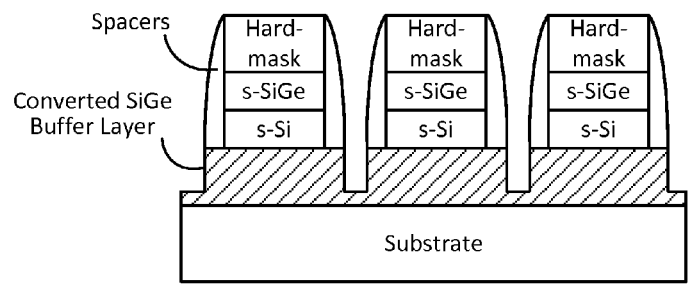
Figure 2I:
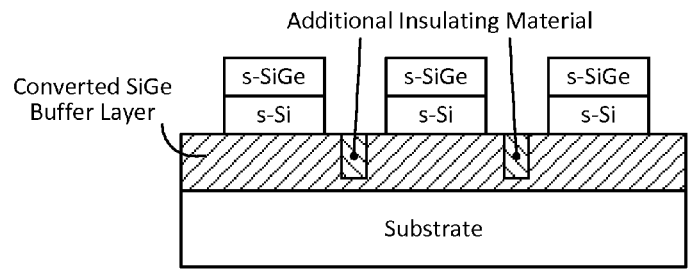
Figure 2I:
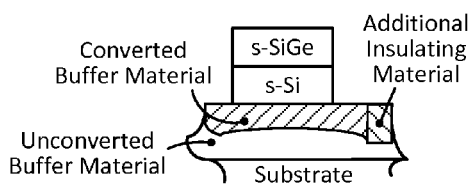
Figure 2I:
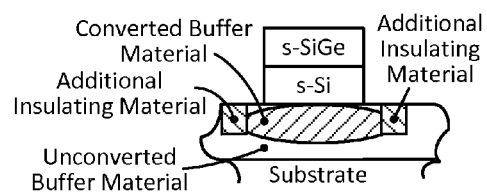

After patterning and Fin formation, a UFO process as previously described can be performed, including: spacer formation (as shown in FIGS. 2e or 2e' and 2f, and previously discussed with reference to FIGS. 1e, 1e', and 1f); buffer layer etching with optional undercut (as shown in FIG. 2g, and previously discussed with reference to FIG. 1g); buffer conversion to an oxide or other electrical insulator material that prevents or otherwise sufficiently inhibits current flow therethrough using thermal re-oxidation or other suitable conversion process (as shown in FIG. 2h, and previously discussed with reference to FIG. 1h); and buffer planarization and hardmask and spacer removal (as shown in FIG. 2i, and previously discussed with reference to FIG. 1i). The process may then continue with conventional or custom techniques to complete the n-type and/or p-type nanowire/nano-ribbon active semiconductor devices (e.g., transistors, diodes or other active devices).

As will be appreciated, the example embodiments shown in FIGS. 1i and 2i show the buffer as being substantially converted (e.g., where 95% or more of the buffer material is converted, up to 98%, 99%, or even 100%). However, in other embodiments, the buffer may be partially converted, as shown in the example embodiments of FIGS. 2i' and 2i", so that there is some amount of unconverted buffer material. In the example embodiment shown in FIG. 2i', only the top regions of the buffer are converted, but the conversion is fairly complete in that upper portion. In the example embodiment shown in FIG. 2i", only the top regions of the buffer are converted, but the conversion in this case is somewhat less complete in that there are unconverted regions above and below the converted portions. This discussion with respect to partial conversion of the buffer layer equally applies to the example embodiment of FIG. 1i. Numerous variations on the size and shape of the converted buffer and unconverted buffer areas will be apparent in light of this disclosure, and the claimed invention is not intended to be limited to any particular configuration.

Figure 3:
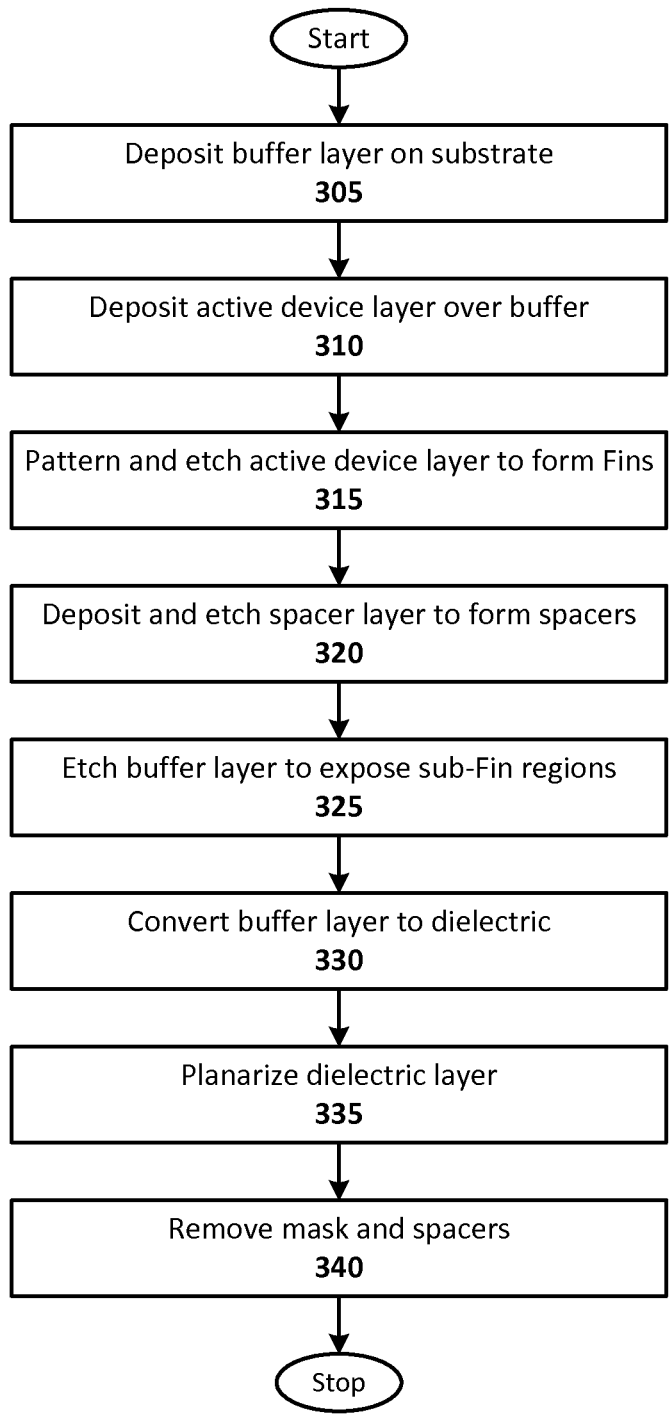
FIG. 3 illustrates a method for fabricating an integrated circuit having a strain-inducing buffer layer that is converted to electrical insulator in at least one location, in accordance with an embodiment of the present invention.

Thus, and with reference to FIG. 3, a method for fabricating an integrated circuit having a strain-inducing buffer layer that is converted to electrical insulator in at least one location, in accordance with an example embodiment of the present invention, may include the following: depositing 305 a buffer layer on substrate; depositing 310 an active device layer over the buffer layer (the active device layer may be configured, for instance, with a single material layer to provide FinFET transistor, or a multilayer material stack to provide nanowire transistors (or nano-ribbon transistors or gate-all-around transistors); patterning and etching 315 the active device layer to form Fins (which may include one or more device layers uniaxially strained in the current flow direction); depositing and etching 320 a spacer layer to form spacers along the Fin sidewalls; etching 325 the buffer layer to expose buffer regions below each of the Fins; converting 330 the buffer layer to an electrical insulator (e.g., oxide that sufficiently impedes current flow from Fin (or wire or ribbon) to underlying substrate, wherein the conversion may include substantially the entire buffer layer or select regions thereof; planarizing 335 the buffer layer, which may include adding more insulating material; and removing 340 the mask and spacers. The method may further include completing the active device layer formation as needed, using any suitable semiconductor process techniques as desired, and depending on the circuitry being formed.

Numerous variations on this methodology will be apparent in light of this disclosure. Considerations for such variations and alternative embodiments may generally include fabricating an aperture for access to reveal a region for oxidation underneath a semiconductor body or Fin. In some examples cases, access to a region under a Fin may be provided by a replacement gate process or a trench contact process, or both. In some embodiments, a portion of the Fin is strapped in place by an overlying feature prior to UFO processing as described herein. In some embodiments, a portion of buffer material is recessed prior to UFO which may reduce the extent of so-called birds-beak formation during subsequent oxidation. In some embodiments, a reflowable oxide is used to fill regions opened during formation of an aperture for access.

Non-Planar Semiconductor Device Configurations

FIG. 4a illustrates a top view of a non-planar semiconductor device architecture, configured in accordance with an embodiment of the present invention. FIGS. 4b, 4b', and 4b" each illustrates a cross-section side view of the semiconductor device of FIG. 4a, as taken along the a-a' axis, configured in accordance with an embodiment of the present invention. FIGS. 4c, 4c', and 4c" each illustrates a cross-section side view of the semiconductor device of FIG. 4a, as taken along the b-b' axis, configured in accordance with an embodiment of the present invention. As can be seen, the semiconductor device formed in the example embodiments illustrated includes a FinFET having a semiconductor body (Fin) formed on a buffer layer and configured with source, drain, and channel regions, with a gate electrode at least partially surrounding a portion of the channel region. Other features, such as source and drain electrodes, gate layer dielectric, and interlayer dielectric (ILD) are not shown, but can be implemented as conventionally done. While a FinFET configuration is shown, nanowire, nano-ribbon, and gate-all-around embodiments will be apparent as well. The semiconductor device may be, for instance, part of a MOS integrated circuit, such as a processor or memory or system-on-chip, but numerous configurations will be apparent.

The semiconductor body or Fin may be composed of a material suitable to allow current flow therefrom during operation of an associated semiconductor device or circuit. For example, in one embodiment, the semiconductor body is composed of a single crystal of a material which may include, but is not limited to, silicon, germanium, SiGe or a III-V compound semiconductor material. In one example embodiment, the channel region is an undoped or lightly doped region of the semiconductor body, and the source and drain regions are heavily doped regions of the semiconductor body. The semiconductor body may be, for example, composed of a group IV material and one or more portions are doped with boron, arsenic, phosphorus, indium or a combination thereof. In another specific example, the semiconductor body is composed of a group III-V material and one or more portions are doped with carbon, silicon, germanium, oxygen, sulfur, selenium, tellurium or a combination thereof. In an embodiment, at least a portion of the semiconductor body is strained. Contact can be made to source and drain regions with a metal species. The metal species may be, for example, a pure metal, such as silver, nickel or cobalt, or may be an alloy such as a metal-metal alloy or a metal-semiconductor alloy (e.g., such as a silicide material).

In an embodiment, the gate electrode is part of a gate electrode stack that includes a metal gate and the gate dielectric layer that includes a high-k dielectric material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of the gate dielectric layer may include a layer of native oxide formed from the top few layers of the semiconductor body. In another embodiment, the gate dielectric layer is comprised of a top high-k portion and a lower portion composed of an oxide of a semiconductor material distinct from the semiconductor body. In one specific embodiment, the gate dielectric layer is composed of a top portion of hafnium oxide and a bottom portion of silicon dioxide or silicon oxy-nitride. The gate electrode may be, for example, composed of polysilicon or a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In one specific embodiment, the gate electrode is composed of a non-workfunction-setting fill material formed above a metal workfunction-setting layer. The gate electrode stack may also include sidewall spacers which may be composed, for instance, of an insulative dielectric material (e.g., silicon dioxide).

The previous discussion with respect to the buffer layer is equally applicable here. In the example embodiments shown in FIGS. 1a-1i and 2a-2i, substantially the entire buffer is converted to an electrically insulating material. As previously indicated with respect to FIGS. 2i' and 2i''', however, other embodiments may include a buffer layer that is more selectively or otherwise partially converted to electrically insulating material. For further example, and with reference to the cross-section side views of FIGS. 4b and 4c, the buffer layer includes one or more electrically insulating regions disposed between the semiconductor body and the substrate. For example, the buffer layer under the channel region has been converted to an electrical insulator (as shown in FIG. 4b), and the buffer layer under each of the source and drain regions has been converted to an electrical insulator (as shown in FIG. 4c).

As can be further seen with reference to FIGS. 4b and 4c, the semiconductor body and converted buffer regions generally have the same width (W), in this example embodiment. However, and as will be appreciated in light of this disclosure, the shape and dimensions of the converted portions of the buffer will depend on factors such as the duration of the buffer conversion process as well as the type of etch used (e.g., isotropic or anisotropic) and whether or not an undercut etch was used when exposing the buffer to be converted (as shown in FIGS. 1g and 2g, for instance). For instance, in the embodiment shown in FIGS. 4b' and 4c', the semiconductor body has a width ($W_F$) and the converted buffer regions generally have a greater width ($W_C$) due to, for example, a buffer conversion process that included a longer thermal annealing process relative to the buffer conversion process used in forming the embodiments shown in FIGS. 4b and 4c, thereby allowing the converted buffer areas to extend beyond the width of the semiconductor body (Fin) in the above active device area. Alternatively, in the embodiment shown in FIGS. 4b'' and 4c'', the semiconductor body has a width ($W_F$) and the converted buffer regions generally have a relatively narrower width ($W_C$) due to, for example, an isotropic undercut etch, thereby allowing the converted buffer areas to be smaller than the width of the semiconductor body (Fin) in the above active device area. In any such cases, note that the converted buffer layer can be subsequently planarized, and in some such embodiments, the planarization is carried out by adding more electrically insulating material (e.g., an oxide material), which can be used to effectively supplement the resulting width of the converted buffer region. As previously explained, the additional insulating material added for planarization may be distinct from the unconverted (if any) and converted regions of the buffer layer, such that the additional insulating material is contiguous with, but not continuous with, the converted and/or unconverted regions of the buffer layer. Note that this detectable distinction (material interface) may be present even when the additional insulating material is the same material as the converted buffer, for instance, and in accordance with some embodiments.

In addition, and as will be appreciated in light of this disclosure, the converted buffer portions may have, for example, relatively straight, convex, or concave sidewalls. For concave/convex shaped sidewalls, the sidewall may be, for example, rounded or faceted. The depth of the converted portion of the buffer layer may run through the entire buffer thickness (e.g., from the bottom of the semiconductor body to the top of the substrate), or only part of the buffer thickness (e.g., from the bottom of the semiconductor body to the middle of the buffer layer, such that only 30% to 80% of the buffer thickness is converted). In addition, the one or more converted regions of the buffer may overlap, such that the converted buffer areas under the source, channel and drain regions effectively form one continuous or contiguous converted buffer area. Alternatively, there may be a non-converted buffer portion between the converted buffer portions below the source and channel regions and/or a non-converted buffer portion between the converted buffer portions below the drain and channel. The degree to which the buffer layer is converted to an electrical isolator, and to which non-converted buffer portions are allowed, will depend on factors such as the desired electrical isolation and performance criteria of the circuit being formed. Numerous such electrical insulator (converted buffer) geometries and shapes can be provisioned as will be appreciated in light of this disclosure, depending on processes and materials used, and the claimed invention is not intended to be limited to any particular configuration.

In some example embodiments, the semiconductor device includes the converted buffer (electrical insulator) only below the channel region. In such a configuration, the electrical isolation between the source/drain regions and the substrate is not provisioned or otherwise enhanced by converting the buffer as described herein. In another embodiment, the semiconductor device includes the converted buffer (electrical insulator) only below the source and drain regions. In such a configuration, the electrical isolation between the channel region and the substrate is not provisioned or otherwise enhanced by converting the buffer as described herein. In yet another embodiment, the semiconductor device includes the converted buffer below each of the channel region, the source region and the drain region. Thus, each of the source and drain regions as well as the channel region can be electrically isolated from the substrate.

As will be appreciated in light of this disclosure, the terms "converted buffer area" or "converted buffer region" are used in some embodiments to convey a discrete electrical insulation structure formed at a given time, e.g., a discrete structure formed only under a channel region, or a pair of discrete structures formed only under a pair of source and drain regions, or a discrete structure formed under a channel region as well as under a pair of source and drain regions. In other embodiments, these terms are used to convey a combination of electrical insulation structures formed at different times, e.g., a discrete structure formed under a channel region in combination with a pair of discrete structures formed, at a different time, under a pair of source and drain regions.

The converted buffer area or areas can generally be any material suitable to electrically isolate at least a portion of the semiconductor body from the substrate. For example, in one embodiment, the converted buffer area or areas comprise a dielectric material such as, but not limited to, silicon dioxide, silicon oxy-nitride, silicon nitride, SiGe oxide, or GaAs oxide. In an embodiment, each converted buffer area is composed of an oxide of the semiconductor material of the buffer layer. In another embodiment, each converted buffer area is composed of an oxide of a semiconductor material different from the semiconductor material of the buffer layer (e.g., due to diffusion into buffer during annealing process, or the deposition of a buffer conversion facilitator material).

As previously explained, the semiconductor device may further include, in an embodiment, a dielectric material disposed adjacent to the converted buffer areas and above the substrate. This dielectric material deposition (for planarization purposes, as previously described) is distinct from the converted buffer areas. For example, even if composed of the same material as the converted buffer areas, the provisioned dielectric material is contiguous with, but not necessarily continuous with, the converted buffer areas (thus, the converted buffer area may be distinct from the surrounding unconverted buffer material and/or planarization material). In an embodiment, the dielectric material is composed of a material suitable to electrically isolate a portion of the gate electrode stack from the substrate. For example, in some specific example embodiments, the dielectric material is composed of a dielectric material such as, but not limited to, silicon dioxide, silicon oxy-nitride or silicon nitride, SiGe oxide, or GaAs oxide.

Numerous variations of the semiconductor devices shown in FIGS. 4a through 4c", as will be apparent in light of this disclosure. For instance, the semiconductor device may further include, in an embodiment, one or more other layers disposed below the buffer layer and on the substrate, such as one or more dielectric layers or graded semiconductor material layers. Likewise, the semiconductor device may further include, in an embodiment, one or more other layers disposed below the device layer and on the buffer layer, such as one or more dielectric layers or graded semiconductor material layers. In addition, semiconductor device may further include one or more nanowires disposed above the semiconductor body. In one such embodiment, the gate electrode stack at least partially surrounds a portion of each of the one or more nanowires. Thus, while some embodiments are directed to single channel device, other embodiments are directed to multiple channel devices. In an embodiment, each of the additional nanowires includes a channel region disposed in the nanowire. In one embodiment, the channel region of each nanowire is discrete in that it is completely surrounded by the gate electrode stack without any intervening material such as underlying substrate material or overlying channel fabrication materials. Accordingly, in embodiments having a plurality of nanowires disposed above semiconductor body, the channel regions of the nanowires and the semiconductor body are discrete relative to one another. In another example embodiment, the semiconductor body and any additional nanowires may be sized as wires or ribbons, depending on width to height ratio, and may have squared-off or rounder corners. In another example embodiment, the dimensions of the semiconductor body and any additional nanowires, from a cross-sectional perspective, are on the nano-scale. For example, in some such embodiments, the smallest dimension of each of the semiconductor body and any additional nanowires is less than 500 nanometers. Still in other such embodiments, the smallest dimension of each of the semiconductor body and any additional nanowires is less than 100 nanometers. Still in other such embodiments, the smallest dimension of each of the semiconductor body and any additional nanowires is less than 20 nanometers. Micrometer scale devices may also be provisioned with various embodiments of the present invention, if so desired.

Figure 5A:
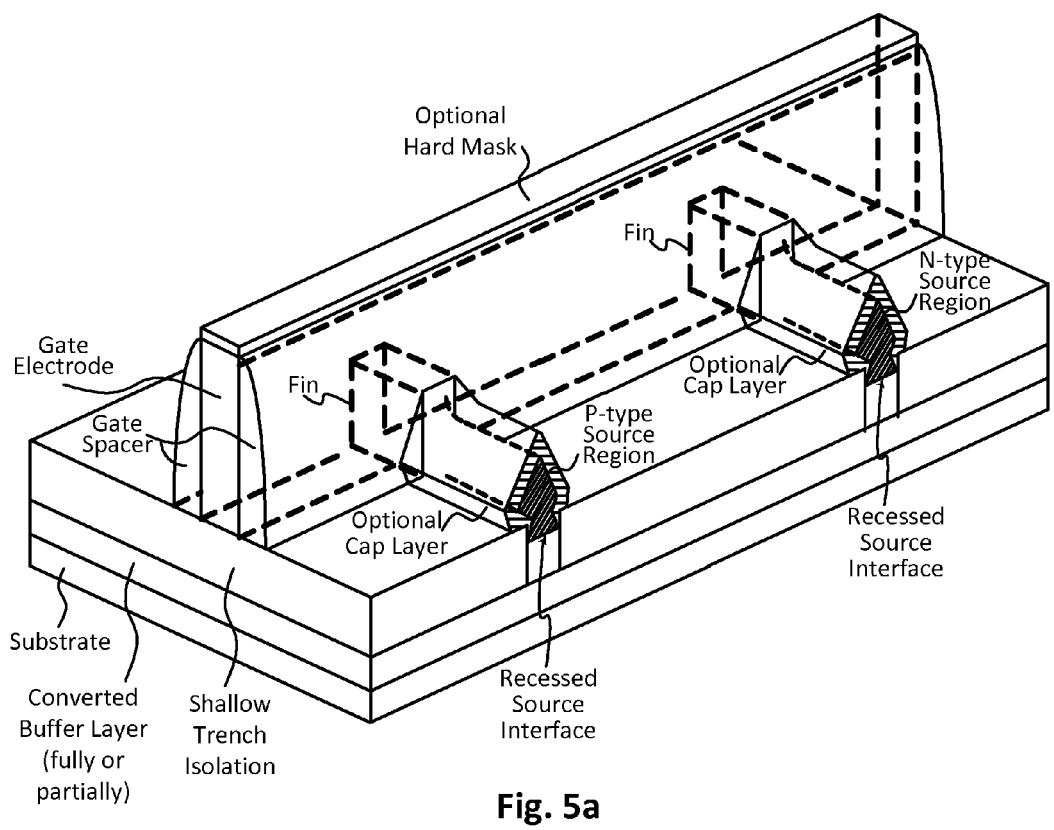
FIG. 5a-e each shows a perspective view of a non-planar semiconductor device architecture, configured in accordance with an embodiment of the present invention.

FIG. 5a-e each shows a perspective view of a non-planar transistor architecture, configured in accordance with one embodiment of the present invention. As can be seen, the example non-planar configuration shown in FIG. 5a is implemented with tri-gate devices each of which includes a substrate having a strain-inducing buffer layer thereon. The buffer layer is at least partially converted to an electrical insulator as described herein, and a plurality of semiconductor bodies or Fins extending from the buffer layer through isolation regions (e.g., shallow trench isolation or other dielectric layer). A gate electrode is formed over three surfaces of the Fin to form three gates. A hardmask is formed on top of the gate electrode. Gate spacers are formed at opposite sidewalls of the gate electrode. A p-type source region comprises an epitaxial region formed on a recessed source interface and on one Fin sidewall, and a p-type drain region (not shown) comprises an epitaxial region formed on a recessed drain interface and on the opposing Fin sidewall. In addition, an n-type source region comprises an epitaxial region formed on a recessed source interface and on one Fin sidewall, and an n-type drain region (not shown) comprises an epitaxial region formed on a recessed source interface and on the opposing Fin sidewall. An optional cap layer is deposited over each of the source/drain regions. Note that the cap layer may be provided in the recessed (tip) regions, but in other embodiments is just provided over the source/drain regions (and not in the recessed regions). In the embodiment, the isolation regions above the buffer layer and adjacent the Fin are shallow trench isolation (STI) regions formed using conventional techniques, such as etching the structure to form trenches, and then depositing oxide material onto the trenches to form the STI regions. The STI regions can be made from any suitable dielectric/insulative material, such as $SiO_2$. The previous discussions with respect to the substrate and buffer layer are equally applicable here. As will be appreciated in light of this disclosure, conventional processes and forming techniques can be used to fabricate the FinFET transistor structure. However, and in accordance with one example embodiment of the present invention, the buffer layer is at least partially converted to an electrical insulator, so as to electrically isolate the channel and/or source/drain regions of the p-type compressively strained FinFET and/or to electrically isolate the channel and/or source/drain regions of the n-type tensilely strained FinFET. As will further be appreciated, note that an alternative to the tri-gate configuration is a double-gate architecture, which includes a dielectric/isolation layer on top of the Fin. Further note that the example shape of the source/drain regions shown in FIG. 5a is not intended to limit the claimed invention to any particular source/drain types or formation processes, and other source/drain shapes (both p and n) will be apparent in light of this disclosure (e.g., round, square or rectangular p and n source/drain regions may be implemented).

Figures 5B, 5C, 5D, 5E:
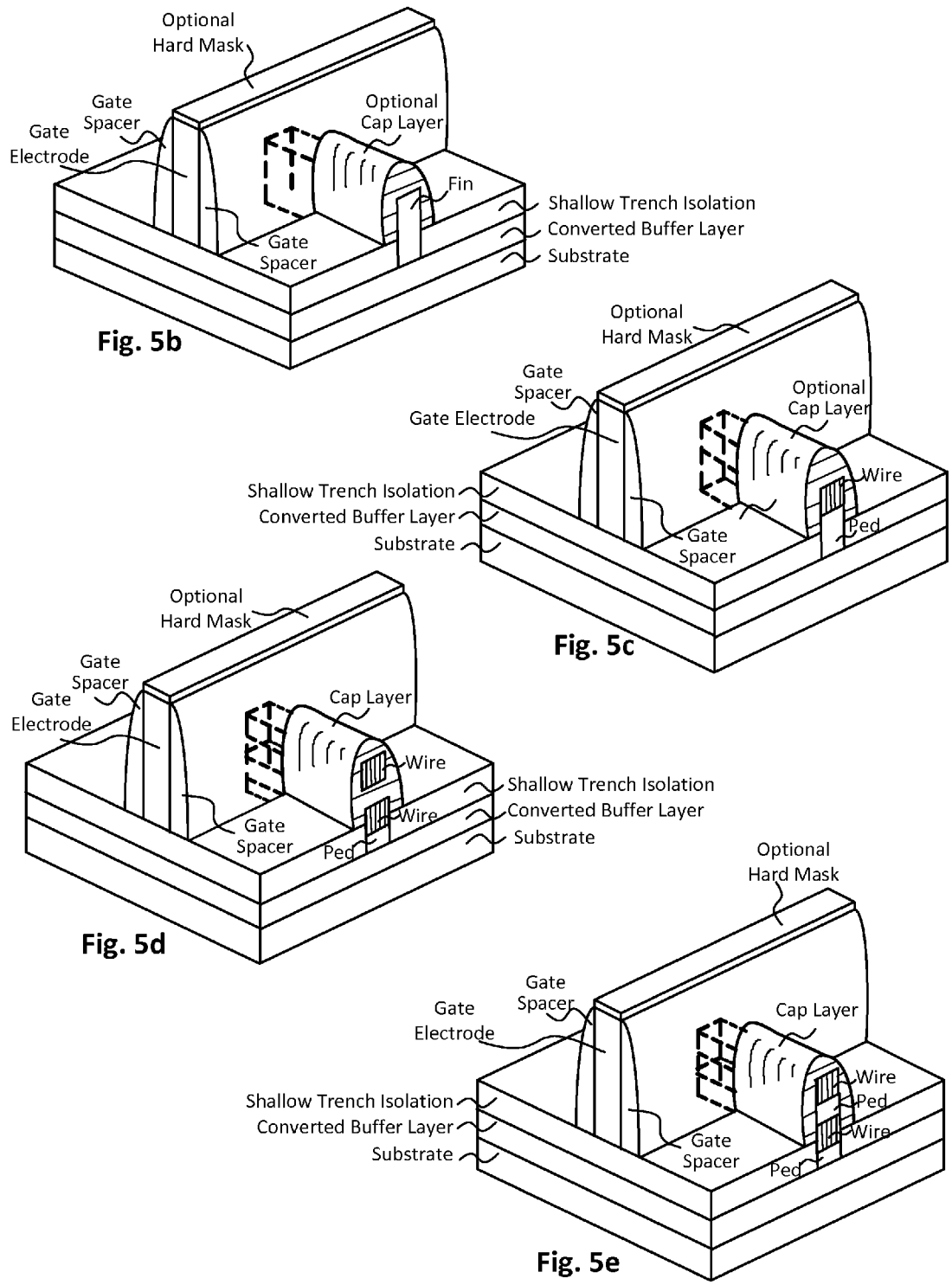

As will be appreciated, the source/drain regions shown in FIG. 5a were formed using a replacement process (e.g., etching, epitaxy deposition, etc). However, in other embodiments, source/drain regions can be part of the Fin formed from the active device layer material itself, as shown in FIG. 5b. Only one source/drain region is shown, but numerous such regions can be implemented in a similar fashion (including both n-type and p-type source/drain regions). An optional cap layer is deposited over the source/drain regions in a similar fashion as previously discussed with reference to FIG. 5a. Other relevant discussion provided with respect to FIG. 5a is also equally applicable here, as will be appreciated.

Another alternative embodiment is the nanowire channel architecture which may include, for example, a pedestal (designated as Ped in the figures) of the active device layer upon which a wire (e.g., silicon or SiGe nanowire) is grown or otherwise provided, as shown in FIG. 5c. Similar to the Fin structure shown in FIG. 5b, the wire includes source/drain regions (only one shown, but multiple such regions can be implemented, including both p-type and n-type, as previously explained). Just as with a Fin structure, the source/drain regions can be formed in the active device layer material (from which the wires are fabricated) or one or more replacement materials (e.g., silicon or SiGe). The optional cap layer can be provided, for instance, around all of the source/drain regions of the wire or just a portion of the wire (e.g., all except the portion on the pedestal). FIG. 5d illustrates a wire configuration having multiple wires (two in this example case). As can be seen, one wire is provided in a recess of the active device layer and the other effectively floats in the cap layer. The corresponding source/drain regions are shown with vertical cross-hatching, and may be p-type and/or n-type source/drain regions. FIG. 5e also illustrates a wire configuration having multiple wires, but in this example case, non-active material is not removed from between the individual nanowires during the nanowire forming process so as to provide a pedestal for the upper wire, which can be carried out using various conventional techniques, as will be appreciated in light of this disclosure. Thus, one wire is provided in a recess of the active device layer and the other wire effectively sits on top of the pedestal (or spacer). Note the wires are active through the channel, but the intermediate pedestal/spacer material is not. The cap layer is provided around all other exposed surfaces of the wires. The corresponding source/drain regions are shown with vertical cross-hatching, and may be p-type and/or n-type source/drain regions. As will be appreciated, any of these embodiments shown in FIGS. 5a through 5e can be implemented in a similar fashion with ribbons (e.g., nanoribbon), which is effectively a relatively flat wire. In all such cases, the strain-inducing buffer both provides the desired compressive and/or tensile strain to one or more various devices in the above active device layer, and provides electrical isolation between that active device layer and the underlying substrate.

Example System

Figure 6:
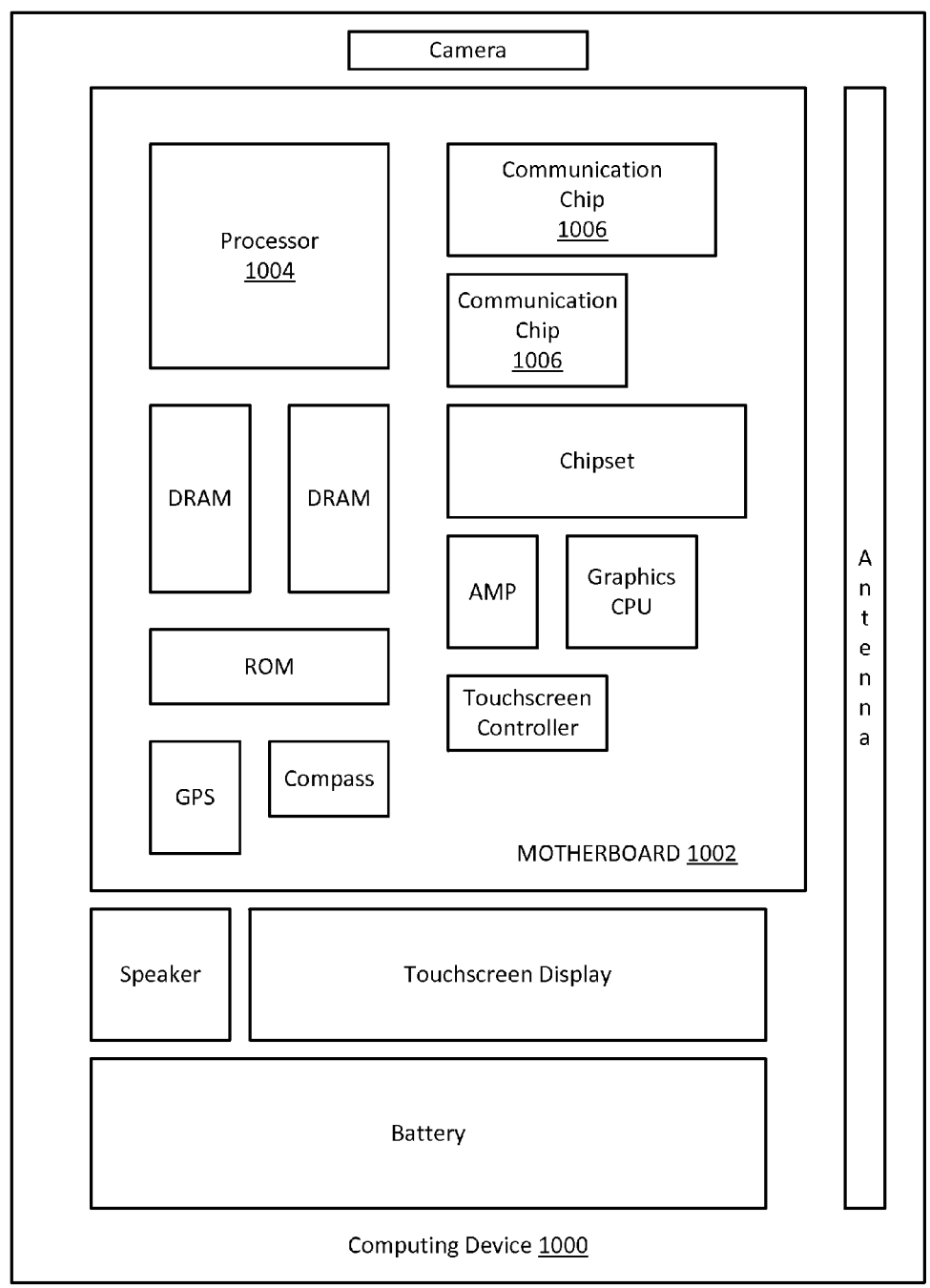
FIG. 6 illustrates a computing system implemented with one or more integrated circuit structures configured in accordance with an embodiment of the present invention.

FIG. 6 illustrates a computing system implemented with one or more integrated circuit structures configured in accordance with an embodiment of the present invention. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured with a buffer layer that both induces strain in an above active device layer, and provides electrical isolation between that active device layer and an underlying substrate. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor 1004 includes a dual purpose buffer (e.g., strain plus electrical insulation) as described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes a dual purpose buffer (e.g., strain plus electrical insulation) as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs low leakage transistor devices as described herein (e.g., CMOS devices having both p and n type devices configured with a dual purpose buffer that both induces one or more strain-types and provides electrical insulation). As will be appreciated in light of this disclosure, various embodiments of the present invention can be used to improve performance on products fabricated at any process node (e.g., in the micron range, or sub-micron and beyond) by allowing for the use of one or more strained device layers (e.g., Si, SiGe, or Si/SiGe) and at the same time reducing standby leakage. Such configurations are particularly advantageous to, for example, for 14nm process node system-on-chip products with stringent standby power requirements. In addition, such configurations allow for better cell re-balancing and so enable a reduction of power supply (e.g., $Vcc_{min}$).

Numerous embodiments will be apparent, and features described herein can be combined in any number of configurations. One example embodiment of the present invention provides a semiconductor device. The semiconductor device includes an active device layer having one or more electronic devices, and a substrate. The device further includes a buffer layer sandwiched between the active device layer and substrate, and having one or more electrically insulating regions between the active device layer and the substrate. In some cases, the substrate comprises a bulk semiconductor substrate. In some such cases, the substrate further comprises an semiconductor oxide layer on a surface of the bulk semiconductor substrate. In some such cases, the substrate is a bulk silicon substrate. In some cases, the active device layer comprises one or more of transistors and/or diodes formed with Fin-based architecture. In some cases, the active device layer comprises one or more of transistors and/or diodes formed with nanowire or nano-ribbon architecture. In some cases, the active device layer comprises multiple semiconductor layers in a stack. In one such case, one of the semiconductor layers of the stack is tensilely strained in a direction of current flow, and another of the semiconductor layers in the stack is compressively strained in a direction of current flow. In another such case, at least one of the semiconductor layers in the stack comprises nanowire or nano-ribbon electronic devices. In some cases, the one or more electrically insulating regions of the buffer layer are distinct from surrounding regions of the buffer layer, such that the one or more insulating regions are contiguous with, but not continuous with, the surrounding regions of the buffer layer. In one such case, at least one of the surrounding regions of the buffer layer comprises an electrically insulating material that is the same as the material in the one or more electrically insulating regions. In another such case, at least one of the surrounding regions of the buffer layer comprises an electrically insulating material that is different from the material in the one or more electrically insulating regions. In some such cases, at least one of the surrounding regions of the buffer layer comprises an electrically insulating oxide material. In some cases, the one or more electrically insulating regions comprise an electrically insulating oxide material. In some cases, the one or more electrically insulating regions comprise substantially the entire buffer layer, such that the one or more electrically insulating regions comprise 90% or more of the buffer layer (note that this 90% or more may include, for example, both converted buffer portions and any additional electrically insulating material adding for planarization, as will be appreciated in light of this disclosure). In some cases, the one or more insulating regions are directly underneath active regions of the active device layer. In some such example cases, the active regions of the active device layer comprise at least one of a channel region, a source region, and/or a drain region of an electronic device formed in the active device layer. In some cases, the buffer layer includes one or more components that is graded in concentration (to facilitate a desired degree of lattice matching, if so desired). In some cases, the active device layer is both compressively stained and tensilely strained. In some cases, the buffer layer is a strain-inducing buffer layer for inducing strain in the active device layer, and current cannot flow from the active device layer to the substrate by passing through the one or more electrically insulating regions. Numerous variations will be apparent. For instance, another embodiment provides an electronic device that includes a printed circuit board having one or more semiconductor devices as variously defined in this paragraph. In one such case, the one or more semiconductor devices comprise at least one of a communication chip and/or a processor.

Another embodiment of the present invention provides an integrated circuit. The integrated circuit includes an active device layer having one or more electronic devices and a substrate comprising a bulk semiconductor substrate. The integrated circuit further includes a buffer layer sandwiched between the active device layer and substrate, and having one or more electrically insulating regions between the active device layer and the substrate. The one or more electrically insulating regions of the buffer layer are distinct from surrounding regions of the buffer layer, such that the one or more insulating regions are contiguous with, but not continuous with, the surrounding regions of the buffer layer.

In some cases, the substrate further comprises an semiconductor oxide layer on a surface of the bulk semiconductor substrate. In some cases, the substrate is a bulk silicon substrate, the buffer layer comprises a relaxed layer of silicon germanium, and the active device layer comprises multiple semiconductor layers in a stack including a strained silicon layer sandwiched between the buffer and a strained silicon germanium layer. In some cases, the active device layer is at least one of tensilely strained in a direction of current flow and/or compressively strained in a direction of current flow. In some cases, at least one of the surrounding regions of the buffer layer comprises an electrically insulating material that is the same as the material in the one or more electrically insulating regions. In other cases, at least one of the surrounding regions of the buffer layer comprises an electrically insulating material that is different from the material in the one or more electrically insulating regions. In some cases, the one or more electrically insulating regions comprise an electrically insulating oxide material. In some cases, at least one of the surrounding regions of the buffer layer comprises an electrically insulating oxide material. In some cases, the buffer layer is a strain-inducing buffer layer for inducing strain in the active device layer, and current cannot flow from the active device layer to the substrate by passing through the one or more electrically insulating regions of the buffer.

Another embodiment of the present invention provides a method for fabricating an integrated circuit. The method includes depositing a buffer layer on a substrate, and depositing an active device layer over the buffer layer. The method continues with patterning and etching the active device layer to form one or more semiconductor bodies uniaxially strained in a current flow direction. The method continues with depositing and etching a spacer layer to form spacers along sidewalls of each semiconductor body, and etching the buffer layer to expose buffer regions below each of the semiconductor bodies. The method continues with converting at least one of the buffer regions below the semiconductor bodies to an electrical insulator that inhibits current flow from that semiconductor body to the substrate. The conversion can be carried out, for instance, using thermal oxidation. The method continues with planarizing the buffer layer by adding more electrically insulating material, and removing the spacers.

The foregoing description of example embodiments of the invention has been presented for the purposes of illustration and description. It is not intended to be exhaustive or to limit the invention to the precise forms disclosed. Many modifications and variations are possible in light of this disclosure. For instance, in some embodiments, the buffer may be effectively divided into multiple parts, where one portion of the buffer is configured to induce a tensile strain while another laterally adjacent portion is configured to induce a compressive strain, and the active device layer over both such buffers locations is the same semiconductor material. Thus, the induced strain can be based on factors such as the active device layer materials and/or the configuration of the underlying buffer. It is intended that the scope of the invention be limited not by this detailed description, but rather by the claims appended hereto.

What is claimed is:

1. A semiconductor device, comprising:
   an active device layer having one or more semiconductor bodies;
   a substrate; and
   a buffer layer sandwiched between the active device layer and the substrate, and having one or more electrically insulating regions between the active device layer and the substrate.

2. The semiconductor device of claim 1 wherein the substrate is a bulk silicon substrate.

3. The semiconductor device of claim 1 wherein the active device layer comprises one or more non-planar transistors formed with Fin-based architecture, and each transistor comprises a channel region included in a corresponding one of the semiconductor bodies.

4. The semiconductor device of claim 1 wherein the active device layer comprises one or more non-planar transistors formed with nanowire architecture, and each transistor comprises a channel region included in a corresponding one of the semiconductor bodies.

5. The semiconductor device of claim 4 wherein the active device layer comprises multiple semiconductor layers in a stack, and wherein at least one of the semiconductor layers in the stack comprises a nanowire.

6. The semiconductor device of claim 5 wherein one of the semiconductor layers of the stack is tensilely strained in a direction of current flow, and another of the semiconductor layers in the stack is compressively strained in a direction of current flow.

7. The semiconductor device of claim 1 wherein the one or more electrically insulating regions of the buffer layer are distinct from surrounding regions of the buffer layer, such that the one or more insulating regions are contiguous with, but not continuous with, the surrounding regions of the buffer layer.

8. The semiconductor device of claim 7 wherein at least one of the surrounding regions of the buffer layer comprises an electrically insulating material that is discernible from the material in the one or more electrically insulating regions.

9. The semiconductor device of claim 1 wherein the one or more electrically insulating regions comprise an electrically insulating oxide material.

10. The semiconductor device of claim 1 wherein the one or more electrically insulating regions comprise only a portion of the entire buffer layer.

11. The semiconductor device of claim 1 wherein the one or more insulating regions are directly underneath active regions of the active device layer, and wherein the active regions of the active device layer comprise at least one of a channel region, a source region, and a drain region of a non-planar transistor comprising a corresponding one of the semiconductor bodies.

12. The semiconductor device of claim 1 wherein the buffer layer includes one or more components that are graded in concentration.

13. A semiconductor device, comprising:
   a bulk semiconductor substrate;
   a device layer above the substrate and including one or more non-planar transistors, each transistor comprising a channel region included in a semiconductor body, each transistor further comprising multiple gates adjacent its channel region; and
   a buffer layer sandwiched between the device layer and the substrate, and having one or more electrically insulating regions between the channel regions and the substrate.

14. The semiconductor device of claim 13 wherein at least one of the one or more non-planar transistors is a FinFET having a tri-gate configuration.

15. The semiconductor device of claim 13 wherein at least one of the one or more non-planar transistors is a nanowire transistor, a nano-ribbon transistor, or a gate-all-around transistor.

16. The semiconductor device of claim 13 wherein each gate comprises a gate dielectric in contact with the corresponding channel region, and a gate electrode in contact with that gate dielectric, each transistor further including:
a source region on one side of the channel region and a drain region on another side of the channel region;
a source contact on the source region; and
a drain contact on the drain region.

17. A non-planar integrated transistor circuit, comprising:
a bulk semiconductor substrate;
one or more non-planar transistors above the substrate, each transistor comprising a channel region included in a semiconductor body, each transistor further comprising multiple gates adjacent its channel region; and
a buffer layer having one or more electrically insulating regions, wherein each channel region is electrically isolated from the substrate by at least one of the one or more electrically insulating regions.

18. The semiconductor device of claim 17 wherein at least one of the one or more non-planar transistors has a FinFET configuration configured with two or more gates.

19. The semiconductor device of claim 17 wherein at least one of the one or more non-planar transistors has a gate-all-around configuration.

20. The semiconductor device of claim 17 wherein each gate comprises a gate dielectric over the corresponding channel region, and a gate electrode over that gate dielectric, each transistor further including:
a source region adjacent the channel region;
a drain region adjacent the channel region;
a source contact conductively coupled to the source region; and
a drain contact conductively coupled to the drain region.

* * * * *